(12) United States Patent
Dasgupta et al.

(10) Patent No.: US 11,205,717 B2
(45) Date of Patent: Dec. 21, 2021

(54) EPITAXIALLY FABRICATED HETEROJUNCTION BIPOLAR TRANSISTORS

(71) Applicant: INTEL CORPORATION, Santa Clara, CA (US)

(72) Inventors: Sansaptak Dasgupta, Hillsboro, OR (US); Marko Radosavljevic, Portland, OR (US); Han Wui Then, Portland, OR (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 345 days.

(21) Appl. No.: 16/326,594

(22) PCT Filed: Sep. 30, 2016

(86) PCT No.: PCT/US2016/054746
§ 371 (c)(1),
(2) Date: Feb. 19, 2019

(87) PCT Pub. No.: WO2018/063319
PCT Pub. Date: Apr. 5, 2018

(65) Prior Publication Data
US 2020/0295166 A1    Sep. 17, 2020

(51) Int. Cl.
*H01L 29/737* (2006.01)
*H01L 21/762* (2006.01)
(Continued)

(52) U.S. Cl.
CPC .... *H01L 29/7371* (2013.01); *H01L 21/76248* (2013.01); *H01L 21/76283* (2013.01);
(Continued)

(58) Field of Classification Search
CPC ... H01L 29/1004; H01L 29/7371–7378; H01L 29/66318; H01L 29/66242; H01L 21/76248
See application file for complete search history.

(56) References Cited

U.S. PATENT DOCUMENTS

| | | | |
|---|---|---|---|
| 4,220,961 A * | 9/1980 | Werner | ............... H01L 27/0233 257/477 |
| 4,829,016 A | 5/1989 | Neudeck | |

(Continued)

FOREIGN PATENT DOCUMENTS

| | | |
|---|---|---|
| TW | 200721529 | 6/2007 |
| WO | 2018063319 A1 | 4/2018 |

OTHER PUBLICATIONS

International Search Report and Written Opinion received for PCT Application No. PCT/US2016/054746. dated Jun. 29, 2017. 12 pages.

(Continued)

*Primary Examiner* — Amar Movva
(74) *Attorney, Agent, or Firm* — Schwabe, Williamson & Wyatt, P.C.

(57) ABSTRACT

Techniques are disclosed for forming a heterojunction bipolar transistor (HBT) that includes a laterally grown epitaxial (LEO) base layer that is disposed between corresponding emitter and collector layers. Laterally growing the base layer of the HBT improves electrical and physical contact between electrical contacts to associated portions of the HBT device (e.g., a collector). By improving the quality of electrical and physical contact between a layer of an HBT device and corresponding electrical contacts, integrated circuits using HBTs are better able to operate at gigahertz frequency switching rates used for modern wireless communications.

20 Claims, 5 Drawing Sheets

(51) Int. Cl.
*H01L 29/08* (2006.01)
*H01L 29/20* (2006.01)
*H01L 29/205* (2006.01)
*H01L 29/207* (2006.01)
*H01L 29/66* (2006.01)
*H01L 29/10* (2006.01)

(52) U.S. Cl.
CPC ...... *H01L 29/0821* (2013.01); *H01L 29/1004* (2013.01); *H01L 29/2003* (2013.01); *H01L 29/205* (2013.01); *H01L 29/207* (2013.01); *H01L 29/66318* (2013.01)

(56) References Cited

U.S. PATENT DOCUMENTS

2010/0224908 A1* 9/2010 Nakazawa .......... H01L 27/0716 257/140
2013/0299879 A1* 11/2013 Liu .................. H01L 29/66242 257/197
2014/0131837 A1* 5/2014 Nie .................. H01L 29/66318 257/565
2014/0361300 A1 12/2014 Camillo-Castillo et al.
2016/0104770 A1* 4/2016 Camillo-Castillo ........................ H01L 29/7325 257/586

OTHER PUBLICATIONS

International Preliminary Report on Patentability received for PCT Application No. PCT/US2016/054746. dated Apr. 2, 2019. 8 pages.
Davis, Robert F., "Substiates and epitaxial deposition processes for Group III-nitride thin films and power device heterostructures," Materials Research Society Bulletin, vol. 40, May 2015. 6 pages.
Hiramatsu, Kazumasa, "Epitaxial lateral overgrowth techniques used in group III nitride epitaxy," Institute of Physics Publishing, Journal of Physics: Condensed Matter 13, 2001, pp. 6961-6975.
Office Action from Taiwan Patent Application No. 106127349, dated Oct. 21, 2021, 4 pgs.
Physica status solidi (a), 188, 1, pp. 183-186, 2001.

* cited by examiner

FIG. 1A
(HBT SCHEMATICS)

EPITAXIALLY FABRICATED HETEROJUNCTION BIPOLAR TRANSISTORS

CROSS-REFERENCE TO RELATED APPLICATIONS

This patent application is a U.S. National Phase Application under 35 U.S.C. § 371 of International Application No. PCT/US2016/054746, filed on Sep. 30, 2016, the entire contents which is hereby incorporated by reference herein.

BACKGROUND

Heterojunction bipolar transistors (HBTs) are commonly used in radio frequency (RF) communication devices. This is because an HBT can receive and process signals with frequencies as high as several hundred gigahertz (GHz) on which modern wireless communication networks are based. HBTs rely on contact between different materials to form the transistor, hence the reference to heterojunction. For illustration, an HBT can be formed by placing a p-type semiconductor layer between two n-type semiconductor layers that are disposed on opposing faces of the p-type semiconductor layer. An alternative HBT configuration can be formed by placing an n-type semiconductor layer between two p-type semiconductor layers that are disposed on opposing faces of the n-type semiconductor layer.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming a vertically configured integrated circuit heterojunction bipolar transistor (HBT) device that includes a laterally grown epitaxial (LEO) base layer that is disposed between corresponding emitter and collector layers of the HBT. Laterally growing the base layer of the HBT according to the methods described herein enables methods of fabricating HBT devices to avoid the use of some etching processes. Using these etching processes in the fabrication of vertically oriented HBT transistors can, as an unintentional consequence, degrade the quality of an interface between semiconductor elements of the HBT and associated electrical contacts (e.g., between a collector and its collector contacts) within an HBT. By avoiding these etching processes, embodiments described herein include HBTs that have a uniform interface surface between semiconductor elements with a relatively low defect density. These surfaces are then able to make good electrical (i.e., low resistance) and good physical contact with an associated portion of the HBT device (e.g., a collector). By improving the quality of electrical and physical contact between a layer of an HBT device and corresponding electrical contacts, integrated circuits using HBTs are better able to operate at gigahertz frequency switching rates used for modern wireless communications.

General Overview

Figure 1A:
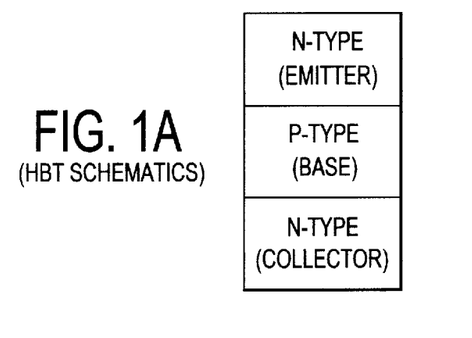
FIGS. 1A and 1B are schematic illustrations of two different configurations of heterojunction bipolar transistors (HBTs).
Figure 1B:
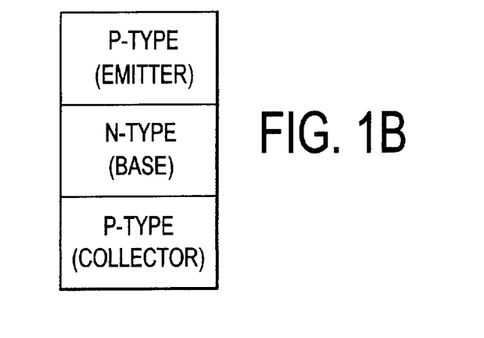

Gigahertz (GHz) range frequencies are commonly used by wireless communications networks (e.g., 3G and 4G networks, local and wide area wireless networks, among others). Devices that are configured to receive, process, and transmit signals using these GHz frequency networks generally are configured to include integrated circuits that can support GHz switching and transmission frequencies. While many semiconductor devices have difficulty operating at GHz frequencies, heterojunction bipolar transistors (HBTs), which are often fabricated with gallium arsenide (GaAs) based devices, are able to operate at these frequencies. HBTs are often depicted as including two different semiconductor materials that are arranged in three layers, each layer forming a portion of the resulting HB transistor. The three portions of the HBT are an "emitter," a "base," and "a collector." The emitter and the collector are configured on opposite sides of an intervening base. The base is fabricated from a semiconductor material with a dopant of opposite polarity from the dopant used in the adjacent collector and emitter. Schematic illustrations of these two configurations appear in FIGS. 1A and 1B. FIG. 1A illustrates a vertically configured "NPN" HBT, in which a base is fabricated from a semiconductor material having a p-type dopant ("p-type" for brevity) and is disposed between an emitter and a collector, both of which are fabricated from a semiconductor material having an n-type dopant ("n-type" for brevity). FIG. 1B illustrates a horizontally configured "PNP" configuration in which an n-type base is disposed between a p-type emitter and a p-type collector. Regardless of the configuration, generally an emitter acts as a negative lead of an HBT and is generally doped with a higher concentration of dopant than either of the base or collector. The collector acts as a positive lead of an HBT. Fabrication of HBTs often includes depositing successive layers of materials, each of which corresponds to an emitter, a base, and a collector. These layers are subsequently etched to expose side surfaces of each layer. Electrical contacts (typically a conductive metal, such as aluminum or copper) are then formed so as to be in electrical contact with one or more of these side surfaces exposed from the etch. However, the surface uniformity of these side surfaces is generally degraded from exposure to the etch. As a result, the quality of contact between the various layers of an HBT and a corresponding electrical contact suffers, causing low current gain and high device leakage. These electrical contacts may also include crystal defects, such as dislocations, which may also contribute to low current gain and high device leakage.

Thus, and in accordance with an embodiment of the present disclosure, techniques are provided for fabricating a heterojunction bipolar transistor (HBT) device using a combination of epitaxial growth and lateral epitaxial overgrowth (LEO) for an emitter, a base, and a collector of the HBT. These techniques do not require the use of etches that can degrade the quality of the interfaces between layers or between a layer and its associated electrical contact. As a result, applying these techniques to the fabrication of HBTs improves the quality of interfaces within an HBT, such as those between a base and an emitter, a collector and a base, and between the electrical contacts to each of the emitter, base, and collector.

As used herein, "epitaxial" generally refers to adjacent crystals that are in contact with one another having a difference in lattice constant of less than 50%. Although neither of the following are required for epitaxial growth, in some examples, the adjacent crystals are single crystals having a same crystallographic structure (e.g., both cubic, both hexagonal, both tetragonal) and in some examples, the adjacent crystals are oriented in a same crystallographic orientation. The use of such epitaxial growth manifests in a structural way. For instance, an angled lateral face will result at a terminus of certain layers that are laterally overgrown via epitaxy. This face is angled according to the crystallographic structure and orientation of single crystal material used as the HBT. The angle can vary from one embodiment to the next depending on the materials used, but in some example cases is in the range of 55° and 62°.

The disclosed techniques of fabricated HBT devices provide various advantages. For example, the disclosed techniques and devices fabricated therefrom have improved GHz frequency performance as a result of lower interfacial resistances between device layers and corresponding electrical contacts. Other benefits of the techniques and devices described herein include low current leakage from devices, which also improves the performance of integrated circuits used to transmit, receive, and process, GHz frequency communication signals.

Methodology and Architecture

Figure 2:
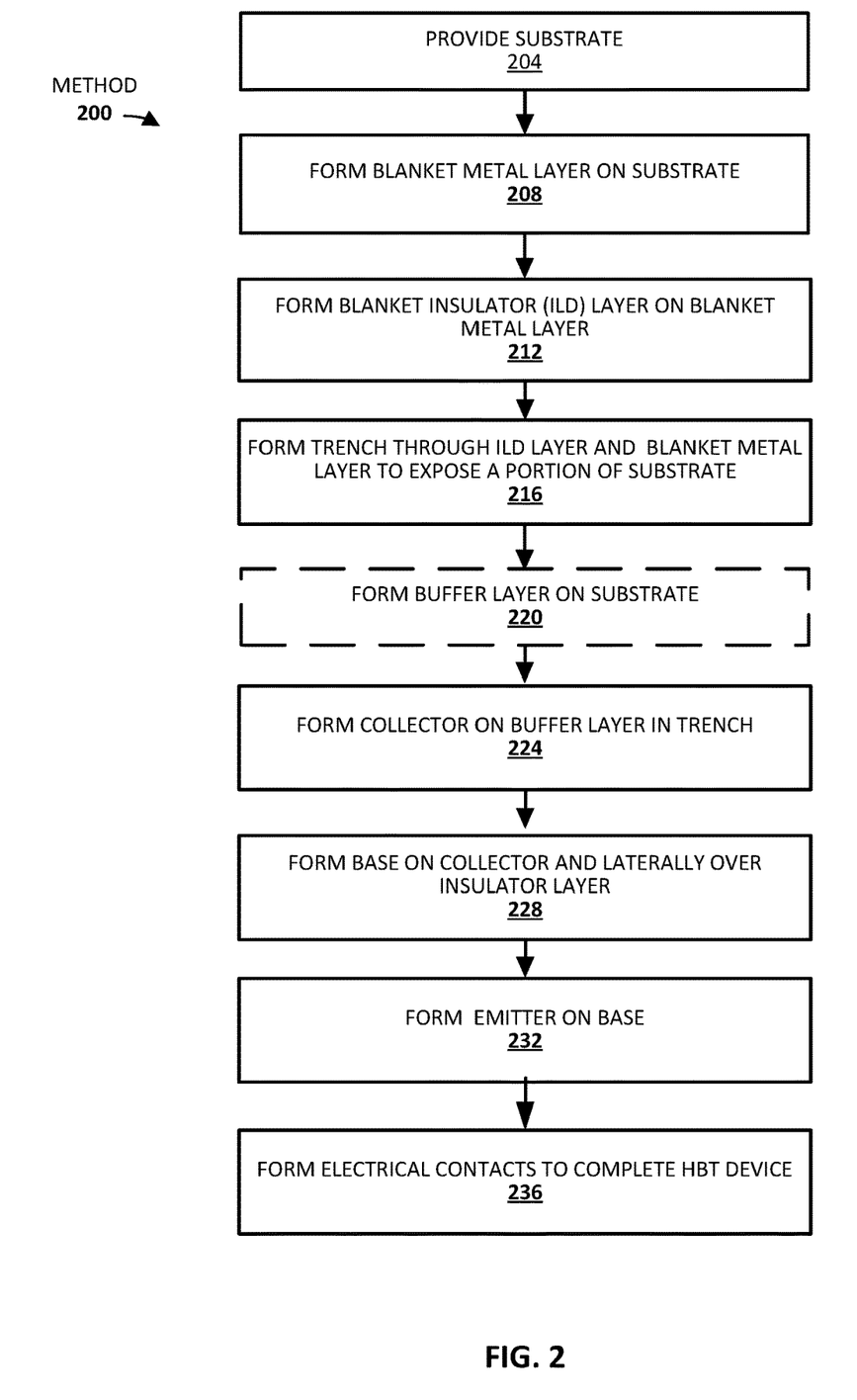
FIG. 2 is a flow diagram of an example method for fabricating HBTs, in accordance with an embodiment of the present disclosure.

FIG. 2 illustrates a methodology 200 for fabricating HBT devices, in accordance with an embodiment of the present disclosure. The description of the method 200 is accompanied by concurrent descriptions of schematic cross-sections of corresponding example interconnect structures. These cross-sections are depicted in FIGS. 3A to 3G.

Figure 3A:
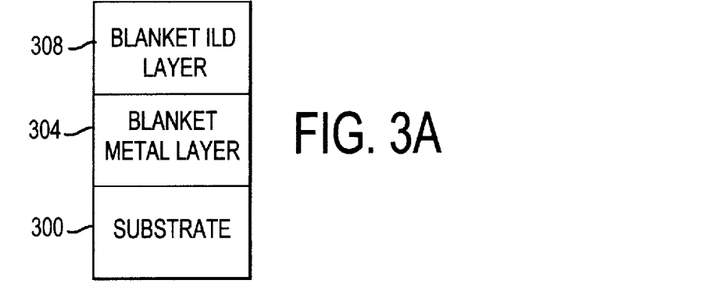
FIGS. 3A-3G are views of an HBT device in progressive states of fabrication according to the example method of FIG. 2, in accordance with an embodiment of the present disclosure.

As can be seen in this example case shown in FIG. 2, with concurrent reference to FIG. 3A, the method 200 includes providing 204 a semiconductor substrate 300. Examples of the substrate 300 include bulk single crystal silicon substrates. A silicon substrate can be oriented in any of the [111] direction, [110] direction, or [100] direction. The orientation of the single crystal silicon substrate determines the convenience by which other layers of an HBT described herein are epitaxially grown on the substrate because the orientation of the substrate determines which crystallographic planes of the substrate, and thus the lattice constants of the crystal, are exposed for processing. Unless otherwise noted, the example substrates 300 described herein are [111] silicon single crystals.

The silicon substrate 300 may also include multilayer substrate configurations, such as a buried oxide (BOX) layer, or be a semiconductor-on-insulator (or "XOI" where X is any semiconductor) substrate. One specific XOI substrate example includes a blanket layer of silicon dioxide ($SiO_2$) disposed between an upper layer of single crystal silicon (Si) and a lower level silicon platform. In a more general sense, the substrate 300 can be any suitable platform upon which an HBT device can be grown as variously provided herein. Other possible example substrate materials include, for instance, germanium, silicon germanium (SiGe), silicon carbide, and gallium arsenide (GaAs), to name a few examples.

As also shown in FIG. 3A, a blanket metal layer 304 is formed 208 on the substrate 300. Examples of the blanket metal layer 304 material include tungsten (W), molybdenum (Mo), and titanium nitride (TiN), among other electrically conductive metals used for electrical contacts. The blanket metal layer 304 is shown in FIG. 3A as having a thickness α that can be within any of the following ranges: 300 nm to 1 µm; 300 nm to 750 nm; 500 nm to 750 nm; 750 nm to 1 µm, according to some example embodiments. Regardless of the metal used, the blanket metal layer 304 is often formed using sputtering to produce a polycrystalline blanket metal layer 304. Sputtering has a number of advantages for this type of application, including the ability to deposit a uniformly thick, homogeneous, polycrystalline layer. However, other deposition types may also be used including chemical vapor deposition (CVD), pressure enhanced CVD (PECVD), among other deposition techniques.

A blanket insulator layer 308 (also referred to as an interlayer dielectric layer or ILD layer for brevity) is formed 212 on the blanket metal layer 304. Example insulator materials that can be used for the blanket ILD layer 308 include, for instance, nitrides (e.g., $Si_3N_4$), oxides (e.g. $SiO_2$, $Al_2O_3$), oxynitrides (e.g., $SiO_xN_y$), carbides (e.g., SiC), oxycarbides, polymers, silanes, siloxanes, or other suitable insulator materials. In some embodiments, the blanket ILD layer 308 is implemented with ultra-low-k insulator materials, low-k dielectric materials, or high-k dielectric materials depending on the application. Example low-k and ultra-low-k dielectric materials include porous silicon dioxide, carbon doped oxide (CDO), organic polymers such as perfluorocyclobutane or polytetrafluoroethylene, fluorosilicate glass (FSG), and organosilicates such as silsesquioxane, siloxane, or organosilicate glass. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The blanket ILD layer 308 is shown in FIG. 3A as having a thickness β that can be within any of the following ranges: 20 nm to 100 nm; 20 nm to 75 nm; 50 nm to 75 nm; 75 nm to 100 nm, according to some example embodiments. In the example shown in FIG. 3A, the blanket ILD layer 308 is an oxide (e.g., $SiO_2$, $Al_2O_3$). Oxides can be conveniently patterned using techniques like photolithography that are followed by etching with a liquid (or "wet") chemical etch, such as hydrofluoric acid (HF), hot sulfuric acid ($H_2SO_4$), among others. Techniques for forming 208 the blanket ILD layer 308 can be any of a wide range of suitable deposition techniques, including but not necessarily limited to: physical vapor deposition (PVD); chemical vapor deposition (CVD); spin coating/spin-on deposition (SOD); and/or a combination of any of the aforementioned. Other suitable configurations, materials, deposition techniques, and/or thicknesses for blanket ILD layer 308 will depend on factors such as a given application and will be apparent in light of this disclosure.

Figure 3B:
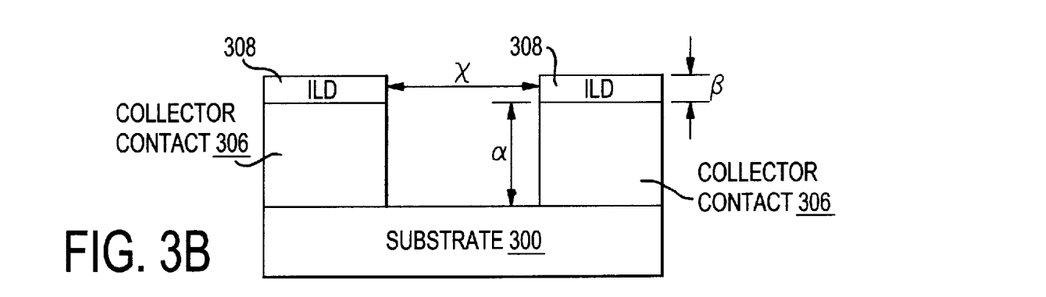

As shown in FIG. 3B, a trench is formed 216 through both of the blanket ILD layer 308 and the blanket metal layer 304, thus exposing a portion of the underlying substrate 300. Generally, the trench formation 216 will occur in two stages due to the different chemistries used to etch through the blanket ILD layer 308 and blanket metal layer 304. For example, as indicated above, in some examples an oxide is used to form 212 the blanket ILD layer 308. The oxide is then conveniently etched using wet chemical etches such as HF, as described above. Some non-oxide compositions of the blanket ILD layer 308 can be etched using wet chemicals, such as acids and bases, that are formulated to remove material from the blanket ILD layer 308.

After using a wet chemical to form 216 a trench through the blanket ILD layer 308, the trench is further formed 216 through the metal layer 304, typically through the use of a "dry" etch. Examples of "dry" etches (i.e., those that do not rely on liquid etchants described above) include reactive ion etches ("RIE"), which are ionized or radicalized atoms of gasses (that can be generated through a plasma) such as argon (Ar) that are used to bombard a surface and thus remove material from the surface. Regardless of the composition of the RIE, it is applied to the blanket metal layer 304 after removal of a portion of the blanket ILD layer 308 so as to expose a portion of the substrate 300.

Upon formation 216 of the trench, the now separate portions of the blanket metal layer 304 shown in FIG. 3B are described as "collector contacts 306." The collector contacts 306 are the electrical contacts for the collector of the HBT, which is described below in more detail.

The trench is shown in FIG. 3B as having a width $\chi$ that can be selected based on a design configuration of the HBT. Examples of trench widths $\chi$ can be in any of the following ranges: 400 nm to 5 µm; 400 nm to 4 µm; 400 nm to 3 µm; 4 µm to 2 µm; 1 µm to 4 µm; 2 µm to 3 µm; 4 µm to 5 µm; 4 µm to 5 µm, according to some example embodiments.

Having exposed a portion of the substrate 300 by formation 216 of the trench, a buffer layer 312 is optionally epitaxially formed 220 within the trench (which is defined by the two collector contacts 306 shown in FIG. 3C) and on the exposed portion of the substrate 300. After deposition of the buffer layer 312, an n-doped collector layer 316 is formed 224 on the buffer layer 312 within the trench.

In the example embodiment shown in FIG. 3C, the optional buffer layer 312 is formed 220 as a barrier layer between the silicon substrate 300 and the subsequently deposited semiconductor collector layer 316, which is described below in more detail. The buffer layer 312, in this example AlN, prevents direct contact between a collector layer 316, in this example fabricated from n-doped GaN (or n-GaN) and the silicon substrate 300. In this example, the optional buffer layer 312 of AlN is formed 220 because GaN and Si react vigorously and exothermically when in direct contact. Formation 220 of the buffer layer 312 prevents this direct contact. The AlN buffer layer 312 also acts as a nucleation layer, facilitating the formation of n-GaN as the collector layer 316 because GaN generally does not nucleate well on Si, even under circumstances in which the GaN and Si do not react with each other. The AlN buffer layer 312 also can prevent crystallographic defects (e.g., slip dislocations) and surface defects from growing from a substrate 300 into the n-GaN collector layer 316, thus disrupting the epitaxial registry between the various layer of the HBT.

Figure 3C:
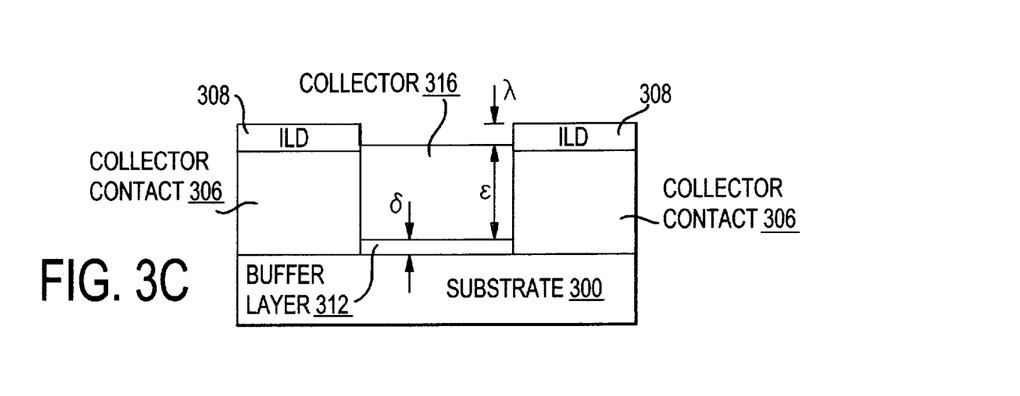

The AlN buffer layer 312 is shown in FIG. 3C as having a thickness δ. Examples of the AlN buffer layer 312 can have a thickness δ in any of the following ranges: 50 nm to 100 nm; 25 nm to 150 nm; 50 nm to 75 nm; 75 nm to 100 nm, according to some example embodiments.

Methods for epitaxially forming 220 the AlN buffer layer 312 on a Si substrate 300 include any methods that can support epitaxial formation with the substrate 300 include, but not limited to metal organic chemical vapor deposition (MOCVD). MOCVD generally begins by introducing gas phase transport of vaporous organometallic precursors and carrier gasses (e.g., argon) into a reaction chamber. Depending on the material to be deposited, nitrogen containing hydrides and diluent gases (often $H_2$ or $N_2$) are also introduced into the reaction chamber with the precursor vapors. The diluent gases suppress pyrolysis of the vapor phase precursors prior to the precursors reaching the heated substrate on which the final material is intended to be deposited. Common precursors for the fabrication AlN films include trimethyl aluminum ($(CH_3)_3Al$), ammonium, among others. Reaction temperatures are often between 500° C. and 1000° C. with gas pressures between 40 Torr and 500 Torr. Further general details regarding MOCVD deposition of Group III-nitride films may be found in "Substrates and epitaxial deposition processes for Group III-nitride thin films and power device heterostructures," by Robert F. Davis, published in MRS Bulletin, volume 40, in May 2015.

As also shown in FIG. 3C, the collector layer 316, in this case n-GaN, is epitaxially formed 224 on the previously formed 220 AlN buffer layer 312 and within the trench defined by the collector contacts 306. The collector layer 316 layer forms the collector of the HBT and is in electrical communication with the collector contacts 306. As with the AlN buffer layer 312, the collector layer 316 can be formed using MOCVD. Example precursors used for the epitaxial formation 224 of n-GaN single crystal as the collector layer 316 on the AlN buffer layer 312 include triethylgallium ($(C_2H_5)_3Ga$) and ammonium, among others. N-type dopants for the collector layer 316 include silicon which can be doped into GaN over a broader temperature range than other n-type dopants. However, other n-type dopants may also be used to dope the collector layer 316 including germanium (Ge), gallium (Ga), or any group IV elements used for n-doping of semiconductor materials. In examples, n-type dopant concentrations in the collector layer 316 can be from $1 \times 10^{17}$ atoms/cm$^3$ to $1 \times 10^{19}$ atoms/cm$^3$, according to some example embodiments.

The n-type doping concentration of the collector layer 316 need not be uniform throughout the entire thickness of the collector layer 316. Traditionally, HBT devices can have a "sub-collector" layer proximate to an underlying substrate that is doped at a higher concentration so as to have a higher conductivity. This higher conductivity facilitates better electrical contact with the associated collector contacts. A collector with a lower doping concentration is then formed on the sub-collector. This lower doping concentration enables the collector to operate at higher voltages (i.e., it has a higher "breakdown" voltage), thus improving the performance of the HBT as a whole. In the collector 316, rather than fabricating a separate sub-collector, the doping concentration can have a gradient as a function of distance from the substrate. For example, portions of the collector 316 proximate to the substrate 300 and the buffer layer 312 can have a higher doping concentration than portions of the collector 316 opposite the substrate 300 (e.g., proximate to the ILD layer 308).

The collector layer 316 is shown in FIG. 3C as having a thickness ε. Examples of the collector layer 316 can have a thickness ε in any of the following ranges: from 200 nm to 1.1 μm; from 200 nm to 800 nm; from 400 nm to 800 nm; from 400 nm to 1.1 μm; from 600 nm to 800 nm, according to some example embodiments.

Regardless of the thickness of the collector layer 316, ε is selected so that a step is present between a top, exposed surface of the collector layer 316 and a top, exposed surface of the ILD layers 308. This step is such that the top, exposed surface of the collector layer 316 is below that of the top, exposed surface of the ILD layers 308. As will be explained below, this facilitates LEO growth of the base portion of the HBT because is ensures that only a single surface (and in some examples a single crystallographic plane) of the collector layer 316 is presented for nucleation and growth of the base portion of the HBT. In examples in which the collector layer 316 extends above the ILD layers 308, side surfaces of the collector layer can act as nucleation sites for the base layer. Because these side surfaces may expose a different crystallographic plane of the collector layer 316 than that exposed by the top surface, the lateral epitaxial growth of the base layer can be compromised.

For this reason, the example shown in FIG. 3C includes the step, a height of which is identified as λ, which can be in any of the following ranges: 10 nm to 100 nm; 25 nm to 200 nm; 50 nm to 100 nm; 75 nm to 150 nm, according to some example embodiments. In some examples, the collector layer 316 can be coplanar with the ILD layers 308 (i.e., λ is approximately 0 nm).

Figure 3D:
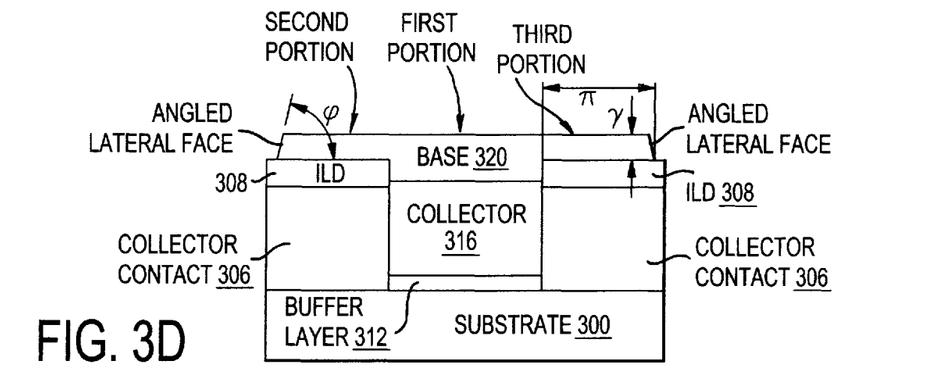

After formation of the collector layer 316, a semiconductor base layer 320 is formed 228. This base layer 320 acts as a base of an HBT and is formed 228 using lateral epitaxial overgrowth (LEO). For convenience of explanation, the portion of the base layer 320 disposed in a column directly over the collector layer 316 is termed a "first portion" of the base layer 320. The portions of the base layer 320 extending laterally from the first portion so as to be disposed on the ILD layers 308 on either side of the collector layer 316 are termed a "second portion" and a "third portion." These three portions are indicated in FIG. 3D. It will be appreciated that these designations are for convenience of explanation only and do not denote any physical differences between the portions of the LEO grown single crystal base layer 320.

Using LEO to form the base layer 320 has a number of advantages. One advantage is that the continued use of epitaxial growth between the various portions of the HBT (i.e., the layers corresponding to the base, emitter, and collector of an HBT) improves the high frequency response of the HBT device. Another advantage is that the use of LEO to grow the base layer 320 enables electrical contacts to be formed (as described below) on the base layer 320 without using etches that would otherwise degrade the uniformity and low defect density of the base layer 320. This also helps maintain an interface between the contacts and the base layer 320 that has a lower electrical resistance than found at surfaces exposed to etches, thus improving the high frequency response of the HBT as a whole.

In one example, the base layer 320 is fabricated from p-GaN. One p-type dopant used for the p-GaN layer 320 is magnesium (Mg). Example Mg concentrations in the p-GaN base layer 320 are in a range of about $1 \times 10^{19}$ atoms/cm$^3$. Alternatives to using p-GaN as a base layer 320 for the of the HBT include, but are not limited to indium gallium nitride (InGaN) and indium nitride (InN). Criteria by which one of GaN, InGaN, or InN is selected as the base includes consideration of the band gaps of the materials used for the base, emitter, and collector in combination with the processing conditions under which the HBT device is to be fabricated. For example, a material used for an emitter layer in an HBT generally is selected (optionally through doping concentration) to have a wide band gap. A base material is selected to have a narrower band gap than the emitter. A collector material is selected to have a band gap equal to or narrower than that of the base material. With these considerations, InGaN for example can be doped to a higher concentration than GaN, which in turn increases the conductivity of the various layers.

Another p-type dopant that may be used to dope the base layer 320 includes zinc (Zn), in an example.

The base layer 320 shown in FIG. 3D is shown as having a thickness of second and third portions extending laterally over the ILD layers 308 as γ. This thickness γ of the second and third portions can be in any of the following ranges: 20 nm to 150 nm; 20 nm to 200 nm; 20 nm to 100 nm; 20 nm to 75 nm; 50 nm to 150 nm; 50 nm to 75 nm; 75 nm to 150 nm, according to some example embodiments. A thickness of the first portion of the p-GaN layer 320 (between the second portion and the third portion) is the thickness γ plus the size of the step λ.

The lateral third portion of the base layer 320 is shown in FIG. 3D as including a dimension π that quantifies the extent to which the base layer 320 extends over the corresponding ILD layer 308. While not shown in FIG. 3D, this dimension π also applies to the second portion of the base layer 320. This dimension π can be in any of the following ranges: from 500 nm to 1 μm; from 200 nm to 700 nm; from 750 nm to 1 μm; from 450 nm to 550 nm, according to some example embodiments.

Because the base layer 320 is grown as a single crystal using LEO, the second and third portions each include a corresponding angled lateral face at a terminus of each of the second and third portions. This face is angled according to the crystallographic structure and orientation of the single crystal base layer 320 (or alternative material used as the base of the HBT). In examples, the angle φ indicated in FIG. 3D of the angled lateral face of the p-GaN base layer 320 is in one example, between 55° and 62°.

As indicated above, the base layer 320 is formed 228 using LEO. LEO increases a growth rate of a crystal laterally relative to a vertical growth rate (as shown in FIG. 3D). LEO can be performed by supplying organometallic precursors to a substrate using a low pressure organo-metallic pressure assisted vapor epitaxial (OMPVE) process. Some LEO techniques use a mask to conceal all but a small portion of a deposition substrate. As shown in FIGS. 3C and 3D, this small portion of the deposition substrate is the exposed portion of the n-GaN collector layer 316. The substrate acts as a nucleation site for the material to be deposited on the substrate. A crystal of the material to be formed by LEO nucleates on the substrate, grows through the hole defined by the mask and laterally expands over the surface of the mask. In embodiments of the present disclosure, no mask is needed because the ILD layer 308 conceals nucleation sites except for the exposed portion of the n-GaN collector layer 316. Conventional LEO techniques are described in "Epitaxial lateral overgrowth techniques used in group III nitride epitaxy," published in the Journal of Physics: Condensed Matter, volume 13, in 2001 (pp. 69661-6975). Lateral growth rates can be further favored over vertical growth rates (by as much as 5:1) by increasing formation temperatures (e.g., from 900° C. to 1050° C.), lowering formation pressures (e.g., from 50 millibar to 300 millibar), and including precursors that favor lateral crystal growth over vertical crystal growth. Once such precursor is Mg, which is one reason to use Mg as a dopant for the p-GaN base layer 320.

Figure 3E:
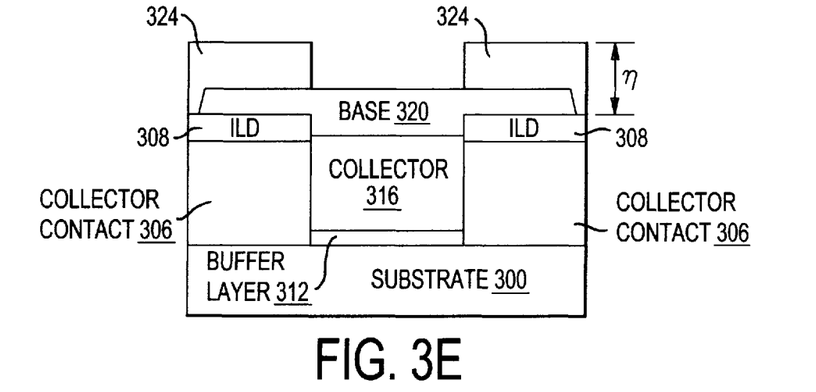

As shown in FIG. 3E, a mask 324, typically one of the oxides or nitrides indicated above in the description of blanket ILD layer 308, is formed over the second and third portions of the base layer 320, leaving the first portion of the base layer 320 exposed. The mask 324 can be deposited using any patterning or photolithography techniques, including those that involve an "air break." In an "air break" process, a wafer on which an HBT device is being fabricated is removed from an inert atmosphere of a processing chamber after deposition of the base 320 layer in order to pattern and form the mask 324. GaN generally does not degrade upon contact with air, which allows this convenience to employed during processing of example HBTs in which GaN is used. However, after formation of the mask 324, the p-GaN base layer 320 surface is exposed to hot hydrochloric acid (HCl) to remove any gallium oxide that may have formed during the air break.

Figure 3F:
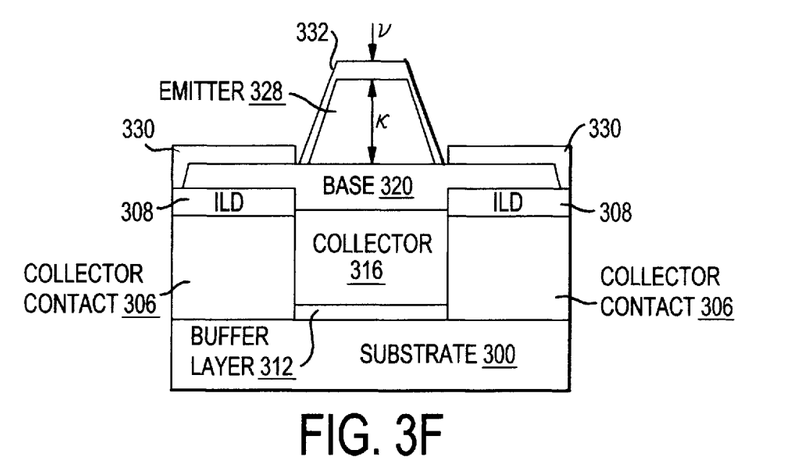

Regardless, after formation of the mask 324 (and after any cleaning of the exposed p-GaN layer 320 surface if "air break" processing is used to pattern the mask 324), an emitter layer 328 is epitaxially formed on the exposed portion of the base layer 320 between masks 324. This is shown in FIG. 3F. The emitter layer 328 is formed using epitaxial deposition, as already described above.

Materials used for the emitter 328 include n-GaN that is doped with, for example, Si as described above. An alternative material for the emitter 328 layer is AlGaN (where the Al content is less than 25 atomic %) doped with Si. Doping concentrations for the emitter 328 include those already described above for Si and that are consistent with the conductivities and operation of an HBT.

The emitter layer 328 shown in FIG. 3F has a thickness κ that can be in any of the following ranges: 100 nm to 500 nm; 100 nm to 250 nm; 250 nm to 500 nm; 200 nm to 400 nm.

Fabrication of the HBT device is completed by forming 236 electrical contacts to the various elements of the HBT. For example, as shown in FIG. 3F, masks 324 are removed and electrical contacts 330 are deposited on the base 320 ("base contacts"). These base contacts 330 can be pattered using photolithography techniques and be fabricated from nickel (Ni), platinum (Pt), copper (Cu), among other conductive elements and compounds. A thin, conformal, and conductive layer 332 is epitaxially grown on the emitter 328 to improve electrical contact with subsequently deposited emitter contacts. Examples of conductive layer 332 include epitaxially formed n-GaN having a doping concentration in any of the following ranges: $1\times10^{18}$ atoms/cm$^3$ to $1\times10^{20}$ atoms/cm$^3$; and $1\times10^{19}$ atoms/cm$^3$ to $1\times10^{20}$ atoms/cm$^3$. Example dopants include n-type dopants, such as Si, previously described.

Figure 3G:
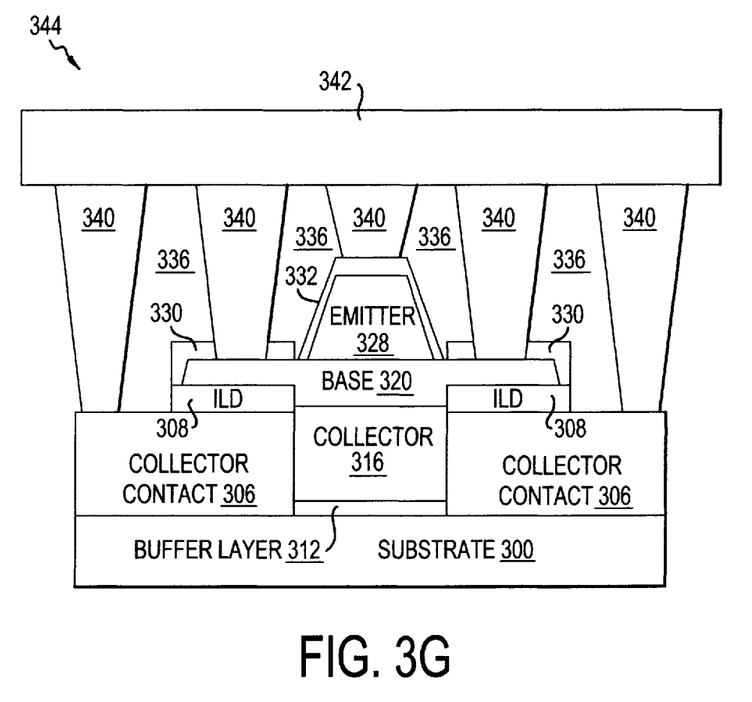

The structure is then encapsulated in ILD layer 336 using materials and processes described above. The ILD layer 336 is planarized to facilitate accurate patterning, and using photolithographic techniques, conductive vias 340 are connected to the various electrical contacts (i.e., collector contacts 306, base contacts 330, and emitter conductive layer 332) to provide for communication of electrical signals from the formed HBT device 344 to a conductive line 342.

Use of the techniques and structures provided herein may be detectable in cross-sections of an integrated circuit using tools such as scanning electron microscopy (SEM) or transmission electron microscopy (TEM) that can show the various layers and structure of the device. Other methods, such as composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, high resolution physical or chemical analysis, to name some suitable example analytical tools. In some embodiments, for instance, a TEM may indicate a base layer grown using LEO and interfaces having a uniformity and quality indicative of the processes described above that do not include the use of etches. Numerous configurations and variations will be apparent in light of this disclosure.

Example System

Figure 4:
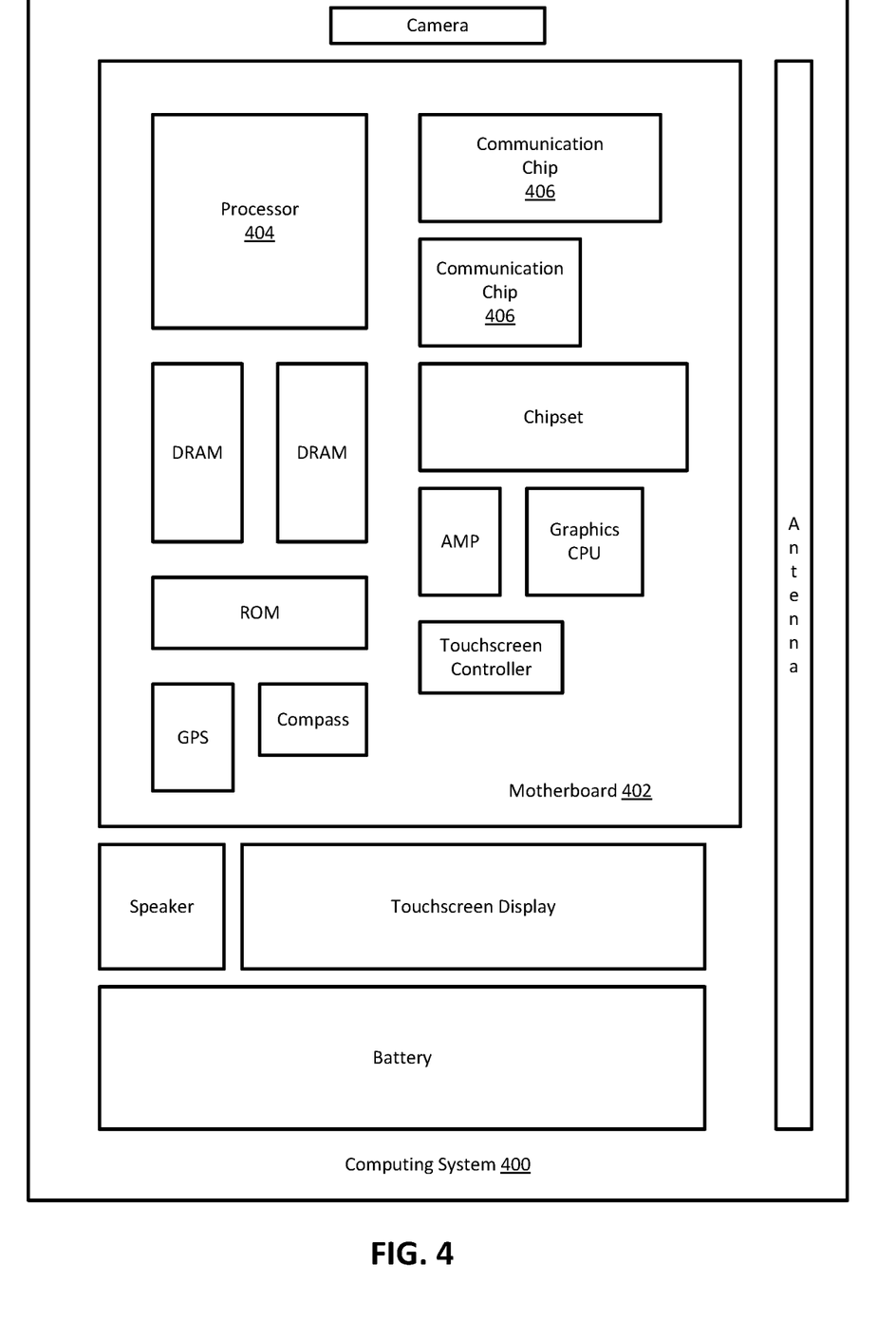
FIG. 4 is an example computing system implemented with one or more of the integrated circuit structures as disclosed herein, in accordance with some embodiments of the present disclosure.

FIG. 4 is an example computing system implemented with one or more of the integrated circuit structures as disclosed herein, in accordance with some embodiments of the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board, whether a main board, a daughterboard mounted on a main board, or the only board of system 400, etc.

Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with an example embodiment (e.g., to include one or more HBTs fabricated using a combination of epitaxial growth and LEO, as variously provided herein). In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others. In some embodiments, communication chip 406 may include one or more transistor structures having a gate stack an access region polarization layer as variously described herein.

The processor 404 of the computing system 400 includes an integrated circuit die packaged within the processor 404. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 406 also may include an integrated circuit die packaged within the communication chip 406. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

Example 1 includes an integrated circuit heterojunction bipolar transistor (HBT) device, comprising: a substrate; a first collector contact and a second collector contact; a first insulator disposed on the first collector contact and a second insulator disposed on the second collector contact; a semiconductor collector layer disposed above the substrate and between at least the first collector contact and the second collector contact; and a semiconductor base layer including a first portion, a second portion, and a third portion, the first portion disposed on the semiconductor collector layer, the second portion extending laterally from the first portion over the first insulator, and the third portion extending laterally from the first portion over the second insulator.

Example 2 includes the subject matter of Example 1, further comprising a buffer layer of aluminum nitride (AlN) disposed between the substrate and the semiconductor collector layer.

Example 3 includes the subject matter of Example 2, wherein the buffer layer of AlN has a thickness in a range from 50 nm to 100 nm.

Example 4 includes the subject matter of any of the preceding Examples, wherein the semiconductor base layer has a thickness in a range from 20 nm to 150 nm.

Example 5 includes the subject matter of any of the preceding Examples, wherein the semiconductor base layer comprises gallium nitride (GaN).

Example 6 includes the subject matter of Example 5, wherein the GaN of the semiconductor base layer is doped with magnesium (Mg).

Example 7 includes the subject matter of Example 6, wherein a doping concentration of Mg in the GaN of the semiconductor base layer is in a range of $1\times10^{19}$ atoms/$cm^3$.

Example 8 includes the subject matter of any of the preceding Examples, wherein the semiconductor base layer comprises indium gallium nitride (InGaN).

Example 9 includes the subject matter of any of the preceding Examples, wherein the semiconductor base layer comprises indium nitride (InN).

Example 10 includes the subject matter of any of the preceding Examples, wherein the second portion and the third portion of the semiconductor base layer each comprise an angled lateral face.

Example 11 includes the subject matter of Example 10, wherein the angled lateral face of both the second portion and the third portion is at an angle with the first insulator and the second insulator, respectively that is in a range of between 55° and 62°.

Example 12 includes the subject matter of Example 10, wherein the angled lateral face of both the second portion and the third portion comprises single crystal semiconductor material of the semiconductor base layer.

Example 13 includes the subject matter of any of the preceding Examples, wherein the second portion and the third portion of the semiconductor base layer extend over the first insulator and the second insulator, respectively in a range of from 200 nm to 700 nm.

Example 14 includes the subject matter of any of the preceding Examples, wherein the second portion and the third portion of the semiconductor base layer extend over the first insulator and the second insulator, respectively in a range of from 400 nm to 600 nm.

Example 15 includes the subject matter of any of the preceding Examples, wherein semiconductor collector layer comprises GaN.

Example 16 includes the subject matter of Example 15, wherein the GaN of the semiconductor collector layer is doped with silicon (Si).

Example 17 includes the subject matter of Example 16, wherein a concentration of Si dopant in the GaN of the semiconductor collector layer is from $1\times10^{17}$ Si atoms/$cm^3$ to $1\times10^{19}$ Si atoms $cm^3$.

Example 18 includes the subject matter of Example 15, wherein the GaN of the semiconductor collector layer is doped with germanium (Ge).

Example 19 includes the subject matter of any of the preceding Examples, wherein the first collector contact and the second collector contact have a thickness in a range from 300 nm to 1 μm.

Example 20 includes the subject matter of any of the preceding Examples, wherein the first collector contact and the second collector contact comprise tungsten (W).

Example 21 includes the subject matter of any of the preceding Examples, wherein the first collector contact and the second collector contact comprise molybdenum (Mo).

Example 22 includes the subject matter of any of the preceding Examples, wherein the first collector contact and the second collector contact comprise titanium nitride (TiN).

Example 23 includes the subject matter of any of the preceding Examples, wherein the first insulator and the second insulator each have a thickness in a range from 20 nm to 100 nm.

Example 24 includes the subject matter of any of the preceding Examples, wherein the first insulator and the second insulator comprise silicon dioxide ($SiO_2$).

Example 25 includes the subject matter of any of the preceding Examples, wherein the first insulator and the second insulator comprise silicon nitride (SiN).

Example 26 includes the subject matter of any of the preceding Examples, wherein the first insulator and the second insulator comprise alumina ($Al_2O_3$).

Example 27 includes the subject matter of any of the preceding Examples, further comprising an emitter disposed on the semiconductor base layer.

Example 28 includes the subject matter of Example 27, wherein the emitter has a thickness in a range of from 100 nm to 500 nm.

Example 29 includes the subject matter of Example 27, wherein the emitter comprises GaN.

Example 30 includes the subject matter of Example 29, wherein the GaN of the emitter is doped with Si.

Example 31 includes the subject matter of Example 29, wherein the GaN of the emitter is doped with aluminum gallium nitride having an aluminum content less than 25 atomic %.

Example 32 includes the subject matter of Example 27, further comprising a GaN layer conformally disposed on the emitter.

Example 33 includes the subject matter of Example 32, wherein the GaN layer disposed on the emitter has a thickness in a range of 50 nm.

Example 34 includes the subject matter of any of the preceding Examples, wherein the substrate, the semiconductor collector layer, and the base layer are all single crystals.

Example 35 includes the subject matter of Example 34, wherein the single crystals of each of the substrate, the semiconductor collector layer having matching crystal structures and crystal orientations.

Example 36 includes an integrated circuit that includes the subject matter of any of the preceding Examples.

Example 37 includes a method for fabricating an integrated circuit heterojunction bipolar transistor (HBT) device, comprising: forming a blanket metal layer on a substrate; forming a blanket insulator layer on the blanket metal layer; etching a trench through the blanket insulator layer and the blanket metal layer to expose a portion of the substrate, wherein portions of the blanket metal layer defining the trench form collector contacts; forming a collector layer in the trench over the substrate; forming a semiconductor base layer on the collector layer using lateral epitaxial overgrowth, the base layer extending laterally from the collector layer over a top surface of the blanket insulator layer defining the trench; and forming an emitter layer on the base layer using epitaxial growth.

Example 38 includes the subject matter of Example 37, wherein the collector layer formed from n-doped gallium nitride (n-GaN).

Example 39 includes the subject matter of any of Examples 37 or 38, wherein the base layer is formed from GaN.

Example 40 includes the subject matter of Example 39, further comprising doping the GaN with p-types magnesium (Mg).

Example 41 includes the subject matter of any of Examples 37 to 40, further comprising forming a buffer layer between the collector layer and the substrate.

Example 42 includes the subject matter of Example 41, wherein the buffer layer is formed from aluminum nitride (AlN).

Example 43 includes the subject matter of any of Examples 37 to 42, wherein the collector layer has a top surface opposite the substrate that is below a top surface of the blanket insulator layer defining the trench.

Example 44 includes the subject matter of Example 43, wherein the top surface of the collector layer acts as a nucleation site for the base layer.

Example 45 includes the subject matter of any of Examples 37 to 44, further comprising forming a conformal conductive layer on the emitter layer.

Example 46 includes the subject matter of any of Examples 37 to 45, wherein the base layer includes a first portion, a second portion, and a third portion, the first portion disposed on the collector layer, the second portion extending laterally from the first portion over the blanket insulator layer, and the third portion extending laterally from the first portion over the insulator layer insulator layer, the second portion and the third portion of the base layer each comprising an angled lateral face.

Example 47 includes the subject matter of Example 46, wherein the angled lateral face of both the second portion and the third portion is at an angle with the first insulator and the second insulator, respectively that is in a range of between 55° and 62°.

Example 48 includes the subject matter of Example 46, wherein the angled lateral face of both the second portion and the third portion comprises single crystal semiconductor material of the semiconductor base layer.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit device, comprising:
a first collector contact and a second collector contact, wherein the first collector contact and the second collector contact comprise a metal;
a first insulator on the first collector contact and a second insulator on the second collector contact;
a semiconductor collector layer between at least the first collector contact and the second collector contact; and
a semiconductor base layer including a first portion, a second portion, and a third portion, the first portion on the semiconductor collector layer, the second portion extending laterally from the first portion over the first insulator, and the third portion extending laterally from the first portion over the second insulator;
wherein the first and second collector contacts, the first and second insulators, the semiconductor collector layer, and the semiconductor base layer are part of a heterojunction bipolar transistor (HBT).

2. The device of claim 1, further comprising a buffer layer of aluminum (Al) and nitrogen (N) between the first collector contact and the second collector contact, and under the semiconductor collector layer.

3. The device of claim 1, wherein the semiconductor base layer comprises gallium (Ga) and nitrogen (N).

4. The device of claim 3, wherein the semiconductor base layer is doped with magnesium (Mg).

5. The device of claim 1, wherein the second portion and the third portion of the semiconductor base layer each comprise an angled lateral face.

6. The device of claim 5, wherein the angled lateral face of both the second portion and the third portion is at an angle with the first insulator and the second insulator, respectively that is in a range of between 55° and 62°.

7. The device of claim 6, wherein the angled lateral face of both the second portion and the third portion comprises single crystal semiconductor material of the semiconductor base layer.

8. The device of claim 1, wherein the second portion and the third portion of the semiconductor base layer extend over the first insulator and the second insulator, respectively, in a range of from 200 nanometers (nm) to 700 nm.

9. The device of claim 1, wherein the second portion and the third portion of the semiconductor base layer extend over the first insulator and the second insulator, respectively, in a range of from 400 nanometers (nm) to 600 nm.

10. The device of claim 1, wherein semiconductor collector layer comprises gallium (Ga) and nitrogen (N).

11. The device of claim 1, further comprising an emitter on the semiconductor base layer.

12. The device of claim 11, wherein the emitter comprises GaN gallium (Ga) and nitrogen (N).

13. The device of claim 11, further comprising a layer including gallium (Ga) and nitrogen (N) on the emitter.

14. The device of claim 1, wherein the semiconductor collector layer and the semiconductor base layer are single crystals.

15. A method for fabricating an integrated circuit heterojunction bipolar transistor (HBT) device, comprising:
    forming a blanket metal layer on a substrate;
    forming a blanket insulator layer on the blanket metal layer;
    etching a trench through the blanket insulator layer and the blanket metal layer to expose a portion of the substrate, wherein portions of the blanket metal layer defining the trench form collector contacts;
    forming a collector layer in the trench over the substrate;
    forming a semiconductor base layer on the collector layer using lateral epitaxial overgrowth, the semiconductor base layer extending laterally from the collector layer over a top surface of the blanket insulator layer defining the trench; and
    forming an emitter layer on the semiconductor base layer using epitaxial growth.

16. The method of claim 15, further comprising forming a buffer layer including aluminum (Al) and nitrogen (N) in the trench before forming the collector layer.

17. An integrated circuit comprising:
    a substrate comprising silicon;
    a first contact and a second contact, both above the substrate, wherein the first contact and the second contact comprise a metal;
    a first insulator on the first contact and a second insulator on the second contact;
    a first layer above the substrate and between at least the first contact and the second contact, the first layer comprising gallium and nitrogen;
    a second layer distinct from the first layer and comprising monocrystalline material, the second layer including a first portion, a second portion, and a third portion, the first portion being on the first layer, the second portion extending laterally from the first portion over the first insulator, and the third portion extending laterally from the first portion over the second insulator, wherein the second portion and the third portion of the second layer each comprise an angled lateral face; and
    a third layer distinct from and on the second layer; wherein the first layer is a collector of a transistor, the second layer is a base of the transistor, and the third layer is an emitter of a transistor.

18. The integrated circuit of claim 17, further comprising a buffer layer including aluminum (Al) and nitrogen (N) between the substrate and the first layer.

19. The integrated circuit of claim 17, wherein the substrate, the first layer, and the second layer are monocrystalline layers, and wherein single crystals of each of the substrate and the second layer have matching crystal structures and crystal orientations.

20. The integrated circuit of claim 17, wherein the angled lateral face of both the second portion and the third portion is at an angle with the first insulator and the second insulator, respectively that is in a range of between 55° and 62°.

* * * * *